(12) United States Patent
Sekiguchi et al.

(10) Patent No.: US 9,111,967 B2
(45) Date of Patent: Aug. 18, 2015

(54) LIQUID PROCESSING METHOD, LIQUID PROCESSING APPARATUS AND STORAGE MEDIUM

(75) Inventors: Kenji Sekiguchi, Nirasaki (JP); Yasushi Fujii, Nirasaki (JP); Tetsuya Sakazaki, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 550 days.

(21) Appl. No.: 13/446,255

(22) Filed: Apr. 13, 2012

(65) Prior Publication Data

US 2012/0260949 A1  Oct. 18, 2012

(30) Foreign Application Priority Data

Apr. 15, 2011 (JP) ................................. 2011-091295
Dec. 19, 2011 (JP) ................................. 2011-277159

(51) Int. Cl.
*B08B 9/00* (2006.01)
*H01L 21/67* (2006.01)
*C11D 7/50* (2006.01)
*C11D 11/00* (2006.01)
*H01L 21/02* (2006.01)
*H01L 21/768* (2006.01)

(52) U.S. Cl.
CPC ........ *H01L 21/67051* (2013.01); *C11D 7/5004* (2013.01); *C11D 11/0047* (2013.01); *H01L 21/02057* (2013.01); *H01L 21/76898* (2013.01)

(58) Field of Classification Search
None
See application file for complete search history.

(56) References Cited

U.S. PATENT DOCUMENTS

| 6,890,864 B2 * | 5/2005 | Aoki et al. ..................... 438/745 |
| 2003/0119318 A1 * | 6/2003 | Niuya et al. .................. 438/690 |
| 2009/0311874 A1 | 12/2009 | Tomita et al. |
| 2010/0075504 A1 | 3/2010 | Tomita et al. |
| 2010/0240219 A1 | 9/2010 | Tomita et al. |
| 2011/0023909 A1 * | 2/2011 | Ito ................................... 134/18 |

FOREIGN PATENT DOCUMENTS

| JP | 11-087290 A | 3/1999 |
| JP | 11-176791 A | 7/1999 |
| JP | 11-340184 A | 12/1999 |
| JP | 2001-015480 A | 1/2001 |
| JP | 2008-047831 A | 2/2008 |
| JP | 2009212301 A * | 9/2009 |
| JP | 2010-103195 A | 5/2010 |

* cited by examiner

*Primary Examiner* — Eric Golightly
(74) *Attorney, Agent, or Firm* — Abelman, Frayne & Schwab

(57) ABSTRACT

Disclosed is a liquid processing method capable of rapidly penetrating a liquid chemical into a concave portion formed on the surface of a substrate with the chemical liquid. The liquid processing method includes wetting the inside of the concave portion by supplying an organic solvent having surface tension smaller than the chemical liquid to the substrate, and cleaning the inside of the concave portion with the chemical liquid by supplying a cleaning liquid including the chemical liquid to the substrate and substituting the liquid inside the concave portion with the chemical liquid.

20 Claims, 2 Drawing Sheets

LIQUID PROCESSING METHOD, LIQUID PROCESSING APPARATUS AND STORAGE MEDIUM

CROSS-REFERENCE TO RELATED APPLICATIONS

This application is based on and claims priorities from Japanese Patent Application Nos. 2011-091295 and 2011-277159, filed on Apr. 15, 2011 and Dec. 19, 2011, respectively, with the Japanese Patent Office, the disclosures of which are incorporated herein in their entireties by reference.

TECHNICAL FIELD

The present disclosure relates to a technique of rapidly penetrating a chemical liquid into a concave portion formed on the surface of a substrate such as a semiconductor wafer in processing the inside of the concave portion with the chemical liquid.

BACKGROUND

Recently, in order to reduce a wire length so as to promote a high speed of a device, a technique stacking a plurality of semiconductor chips in a thickness direction (referred to as, for example, a 3D-LSI) has been proposed. In order to electrically connect the semiconductor chips stacked in the thickness direction, a through electrode that passes through a silicon wafer forming the semiconductor chip in the thickness direction is formed and is called as a through-Si via (TSV). See, for example, Japanese Patent Application Laid-Open No. 2010-103195.

The formation of the TSV includes an etching process of forming a bottomed hole (for example, a hole having a diameter of about 10 µm and a depth of about 100 µm) on the silicon wafer by dry etching, such as for example, reactive ion etching (RIE) and an embedding process where a conductor is embedded in the hole. A film-forming process of forming a thin film such as an insulating film, a barrier film, and a seed film on at least the inner side of the hole is performed between the etching process and the embedding process as necessary. If the hole is formed by the dry etching, a residue such as polymer is attached to the inner side of the hole. The residue having a bad influence on the subsequent embedding process and the film-forming process as the previous process, needs to be completely removed.

In order to remove the residue, a cleaning processing is performed using the chemical liquid. Because the hole for the TSV has a very large aspect ratio (hole depth/hole diameter), the chemical liquid hardly penetrates into the hole. Although the chemical liquid may penetrate into the hole a prolonged time has elapsed, it is not desirable because the productivity of the semiconductor device is deteriorated. In some cases, even though the etching rate is low, the chemical liquid for removing the residue may etch other useful films formed in advance such as the insulating film that covers the entire surface of the wafer. From this viewpoint, the chemical liquid processing may not be performed for a long time. Such problem is not limited to the formation of the TSV, and similarly exists even in processing of a substrate having a minute concave portion (for example, holes and trenches), particularly, a minute concave portion having a high aspect ratio.

SUMMARY

An exemplary embodiment of the present disclosure provides a liquid processing method of cleaning the inside of a concave portion formed on the surface of a substrate with a cleaning liquid including a chemical liquid, the method including: wetting the inside of the concave portion of the substrate with an organic solvent by supplying the organic solvent having surface tension smaller than the chemical liquid to the substrate; and cleaning the inside of the concave portion with the chemical liquid by supplying the chemical liquid to the substrate and substituting the liquid wetting the inside of the concave portion with the chemical liquid, after the wetting.

The foregoing summary is illustrative only and is not intended to be in any way limiting. In addition to the illustrative aspects, embodiments, and features described above, further aspects, embodiments, and features will become apparent by reference to the drawings and the following detailed description.

DETAILED DESCRIPTION

Figure 1:
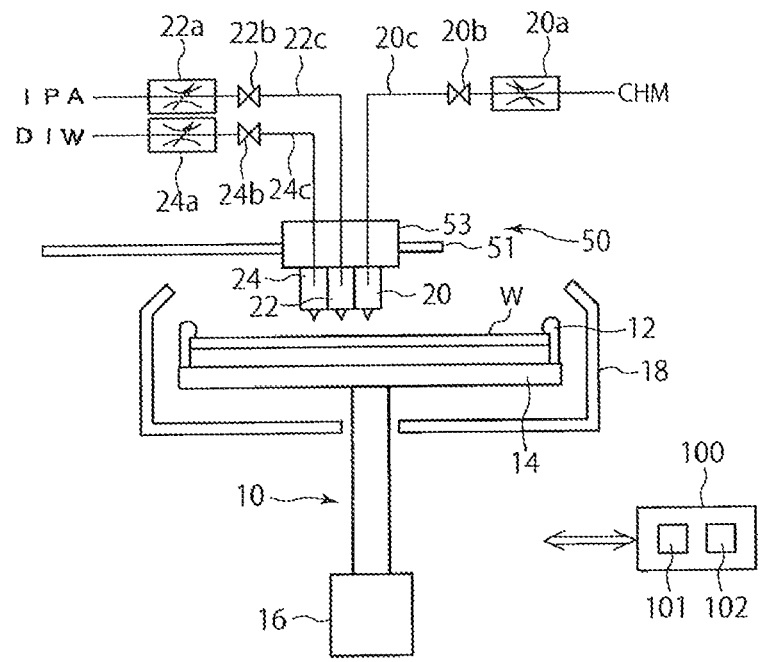
FIG. 1 is a schematic view illustrating a configuration of a cleaning apparatus for performing a cleaning method.
Figure 2:
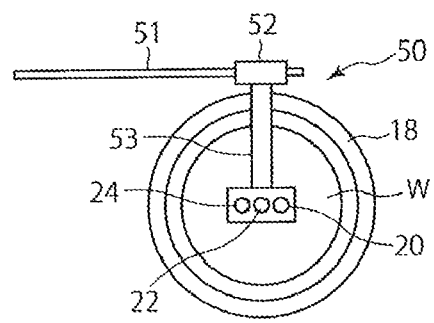
FIG. 2 is a plan view illustrating a part of the cleaning apparatus shown in FIG. 1.

In the following detailed description, reference is made to the accompanying drawing, which form a part hereof. The illustrative embodiments described in the detailed description, drawing, and claims are not meant to be limiting. Other embodiments may be utilized, and other changes may be made, without departing from the spirit or scope of the subject matter presented here.

The present disclosure has been made in an effort to provide a technique of rapidly penetrating a chemical liquid into a concave portion in cleaning the inside of the concave portion formed on the surface of a substrate with the chemical liquid.

An exemplary embodiment of the present disclosure provides a liquid processing method of cleaning the inside of a concave portion formed on the surface of a substrate with a cleaning liquid including a chemical liquid, the method includes wetting the inside of the concave portion of the substrate with an organic solvent by supplying the organic solvent having surface tension smaller than the chemical liquid to the substrate, and cleaning the inside of the concave portion with the chemical liquid by supplying the chemical liquid to the substrate and substituting the liquid wetting the inside of the concave portion with the chemical liquid, after the wetting.

In the liquid processing method, the organic solvent is isopropylalcohol (IPA), xylene, or a mixture of the IPA and hydrofluoroether (HFE).

In the liquid processing method, the chemical liquid may be an inorganic cleaning liquid.

The liquid processing method further includes substituting the organic solvent wetting the inside of the concave portion with deionized water (DIW) by supplying the DIW to the substrate, after the wetting and before the cleaning. The DIW wetting the inside of the concave portion is substituted with the chemical liquid in the cleaning.

In the liquid processing method, a heated DIW may be supplied in the substituting.

In the liquid processing method, the inorganic cleaning liquid may be any one of a DHF (diluted hydrofluoride) liquid, an SC-1 liquid, an SC-2 liquid, or a HF-based chemical liquid in which one liquid or a mixed liquid of two or more liquids selected from the group consisting of an HF liquid, an $NH_4F$ liquid, and an $NH_4HF_2$ liquid is diluted with the DIW.

In the liquid processing method, the chemical liquid may be an organic cleaning liquid.

In the liquid processing method, the organic solvent wetting the inside of the concave portion may be directly substituted with the organic cleaning liquid in the cleaning.

In the liquid processing method, the organic cleaning liquid includes dimethyl sulfoxide and a mixture containing an organic solvent miscible with dimethyl sulfoxide.

In the liquid processing method, the organic solvent miscible with dimethyl sulfoxide uses one or more selected from the group consisting of N,N-dimethyl acetamide, N,N-dimethyl formamide, N-methyl pyrrolindone, and N,N-dimethyl imidazolidinone.

In the liquid processing method, a heated organic solvent may be supplied in the wetting.

The liquid processing method further includes: supplying a first rinse liquid including an organic solvent to the substrate to substitute the chemical liquid in the concave portion with the first rinse liquid, after the cleaning; supplying a second rinse liquid including DIW to the substrate to substitute the first rinse liquid in the concave portion with the second rinse liquid, after the supplying the first rinse liquid; and drying the substrate, after the supplying the second rinse liquid.

In the liquid processing method, the IPA may be supplied to the substrate in the drying.

The liquid processing method further includes: rinsing the substrate by supplying a rinse liquid to the substrate to substitute the chemical liquid in the concave portion with the rinse liquid, after the cleaning; and drying the substrate, after the rinsing. The IPA may be supplied to the substrate in the drying.

Another exemplary embodiment of the present disclosure provides a liquid processing apparatus, which includes a substrate holding part that holds a substrate; a chemical liquid nozzle that ejects a cleaning liquid including a chemical liquid; an organic solvent nozzle that ejects an organic solvent having surface tension smaller than the chemical liquid; an organic solvent supply mechanism that supplies the organic solvent to the organic solvent nozzle; a chemical liquid supply mechanism that supplies the chemical liquid to the chemical liquid nozzle; and a controller that controls operations of the organic solvent supply mechanism and the chemical liquid supply mechanism to perform a wetting of supplying the organic solvent to the substrate held by the substrate holding part and thereafter, a cleaning of supplying the chemical liquid to the substrate.

The liquid processing apparatus further includes: a DIW nozzle that ejects deionized water (DIW); and a DIW supply mechanism that supplies the DIW to the DIW nozzle. The controller controls the operation of the DIW supply mechanism to further perform a DIW substitution of substituting the organic solvent on the substrate with the DIW by supplying the DIW to the substrate, between the wetting and the cleaning.

In the liquid processing apparatus, the controller may be configured to perform the cleaning so that the organic solvent on the substrate is directly substituted with the chemical liquid by supplying the chemical liquid to the substrate in the cleaning.

Yet another exemplary embodiment of the present disclosure provides a computer-readable storage medium storing a program that, when executed, causes a computer to control a liquid processing apparatus to perform a liquid processing method comprising: wetting the inside of a concave portion formed on the surface of a substrate with an organic solvent by supplying the organic solvent having surface tension smaller than the chemical liquid to the substrate; cleaning the inside of the concave portion with the chemical liquid by supplying the chemical liquid to the substrate and substituting the liquid wetting the inside of the concave portion with the chemical liquid. The liquid processing apparatus includes a chemical liquid nozzle that ejects the chemical liquid, an organic solvent nozzle that ejects an organic solvent having surface tension smaller than the cleaning liquid including a chemical liquid, an organic solvent supply mechanism that supplies the organic solvent to the organic solvent nozzle, and a chemical liquid supply mechanism that supplies a chemical liquid to the chemical liquid nozzle.

In the computer-readable storage medium, the liquid processing apparatus further includes a DIW nozzle that ejects deionized water (DIW) and a DIW supply mechanism that supplies the DIW to the DIW nozzle. When the controller controls the operation of the DIW supply mechanism to further perform substituting the organic solvent on the substrate with the DIW by supplying the DIW to the substrate, between the wetting and the cleaning.

In the computer-readable storage medium, the controller may be configured to perform the cleaning so that the organic solvent on the substrate is directly substituted with the chemical liquid by supplying the chemical liquid to the substrate in the cleaning.

The organic solvent in the concave portion may be directly substituted with the chemical liquid. After the organic solvent in the concave portion is first substituted with other liquid, the other liquid may be substituted with the organic solvent.

According to the exemplary embodiments of the present disclosure, it is possible to fill the inside of the concave portion with the chemical liquid in a short time by first penetrating an organic solvent having low surface tension, which more easily penetrates into the inside of the concave portion, into the concave portion and supplying the chemical liquid in the state where a liquid is included in the inside of the concave portion to substitute the chemical liquid with the liquid.

Hereinafter, exemplary embodiments will be described with reference to the accompanying drawings.

First, the configuration of a substrate cleaning apparatus which is an exemplary embodiment of a liquid processing apparatus will be described. The substrate cleaning apparatus includes a spin chuck 10 substantially horizontally holding and rotating a substrate which may be a semiconductor wafer W in the exemplary embodiment. Spin chuck 10 includes a substrate holding part 14 horizontally holding the substrate by a plurality of holding members 12 for holding the periphery portion of the substrate and a rotation driving part 16 rotatably driving substrate holding part 14. A cup 18 receiving a processing liquid scattered from wafer W is installed around substrate holding part 14. Substrate holding part 14 and cup 18 may relatively move in a vertical direction so as to transfer wafer W between a substrate transfer arm (not shown) and substrate holding part 14.

The substrate cleaning apparatus further includes a chemical liquid nozzle 20 for supplying a cleaning liquid including the chemical liquid to wafer W, an IPA nozzle 22 (organic solvent nozzle) for supplying isopropylalcohol (IPA) as an organic solvent to wafer W, and a DIW nozzle 24 for supplying deionized water (DIW) to wafer W. The chemical liquid is supplied to chemical liquid nozzle 20 from a chemical liquid supply source CHM through a chemical liquid pipe line 20*c* having a flow rate control valve 20a and an opening/closing valve 20b. The IPA is supplied to IPA nozzle 22 from an IPA supply source IPA through an IPA pipe line 22c having a flow rate control valve 22a and an opening/closing valve 22b. The DIW is supplied to DIW nozzle 24 from a DIW supply source DIW through a DIW pipe line 24c having a flow rate control valve 24a and an opening/closing valve 24b. Flow rate control valve 20a, opening/closing valve 20b, and chemical liquid pipe line 20c configure a chemical liquid supply mechanism. Flow rate control valve 22a, an opening/closing valve 22b, and IPA pipe line 22c configure an IPA supply mechanism (pre-wet liquid supply mechanism). And flow rate control valve 24a, opening/closing valve 24b, and DIW pipe line 24c configure a DIW supply mechanism.

Chemical liquid nozzle 20, IPA nozzle 22, and DIW nozzle 24 are driven by a nozzle moving mechanism 50. Nozzle moving mechanism 50 includes a guide rail 51, a driving mechanism-embedded mover 52 which can move along guide rail 51, and a nozzle arm 53 of which a base end is attached to mover 52 and a front end holds chemical liquid nozzle 20, IPA nozzle 22, and DIW nozzle 24. Nozzle moving mechanism 50 may move chemical liquid nozzle 20, IPA nozzle 22, and DIW nozzle 24 between a position just above the center of wafer W held at substrate holding part 14 and a position just above the periphery of wafer W and may also move chemical liquid nozzle 20, IPA nozzle 22, and DIW nozzle 24 up to a waiting position outside cup 18 when being viewed from the above.

The substrate cleaning apparatus includes a controller 100 integrally controlling the entire operation thereof. Controller 100 controls the operations of all functional components of a wet etching apparatus such as for example, rotation driving part 16, valves 20a, 20b, 22a, 22b, 24a, and 24b, nozzle moving mechanism 50. Controller 100 may be implemented with, for example, a general computer as hardware and programs (for example, a device control program, and a processing recipe) for operating the general computer as software. The software is stored in a storage medium such as a hard disk drive which is fixedly installed in the computer or a storage medium such as a CDROM, a DVD, and a flash memory which are detachably set in the computer. The storage medium is represented by reference numeral 101. A processor 102 calls and executes a predetermined processing recipe from storage medium 101 based on an instruction of, for example, a user interface (not shown) as necessary, and each functional component of the substrate cleaning apparatus operates under the control of controller 100 thereby executing predetermined processing.

Substrate holding part 14 of spin chuck 10 shown in the drawings is so-called a mechanical chuck type, which grasps the periphery of wafer W by a movable holding member 12, but is not limited thereto, and may also be so-called a vacuum chuck type which vacuum-suctions the backside center of wafer W. Nozzle moving mechanism 50 shown in the drawings is so-called a linear motion type which performs translation of the nozzles, but may also be so-called a swing arm type in which the nozzle is held at the front end of an arm swinging around a vertical shaft line. In the shown example, three nozzles 20, 22, and 24 are held by a common arm, but may also be held by a separate arm to independently move.

Next, a series of processes of the substrate cleaning processing performed by the substrate cleaning apparatus will be described. A series of processes to be described below are executed by controlling each functional component of the substrate cleaning apparatus by controller 100 so that various process parameters defined in the process recipe stored in storage medium 101 are implemented.

First, a first exemplary embodiment of the substrate cleaning processing will be described. In the exemplary embodiment, wafer W which is an object to be processed is a silicon wafer of which a hole for TSV (for example, a hole having a diameter of about 9 μm and a depth of about 100 μm) is formed on the surface thereof by dry etching, as shown in photographs of FIGS. 3 and 4 for describing an experimental result below. A resist film is already removed by an ashing process which is a dry process. Polymer, which is generated by dry-etching using $SF_6$ gas+HBr gas using silicon (Si) as etching gas, is attached to the inner surface of the hole of wafer W. In order to remove the polymer, an inorganic cleaning liquid, for example, diluted hydrofluoric acid (DHF) is used as the chemical liquid in the exemplary embodiment.

First, wafer W in the aforementioned state is carried in to the substrate cleaning apparatus by a transfer arm (not shown) to be held at substrate holding part 14 of spin chuck 10.

<Pre-Wetting Process (First Pre-Wet Process)>

As a pre-wet liquid, the IPA maintained at the room temperature is ejected from IPA nozzle 22 at a predetermined flow rate, for example, 10 ml/min to 500 ml/min for a predetermined time, for example, 30 sec to 180 sec, by positioning IPA nozzle 22 just above the center of wafer W and rotating wafer W at a predetermined revolution, for example, 200 rpm to 2000 rpm. The IPA supplied to the center of wafer W is diffused by a centrifugal force to uniformly wet the entire surface of wafer W. Herein, since surface tension for wafer W of the IPA is relatively small by about 21.7 dyne/cm (21.7× $10^{-3}$ N/m), the IPA easily penetrates up to the bottom of a fine and deep hole to fill the inside of the hole and wets the entire inner surface of the hole.

<DIW Substitution Process (Second Pre-Wet Process)>

Next, DIW is ejected from DIW nozzle 24 at a predetermined flow rate, for example, 300 ml/min to 1500 ml/min for a predetermined time, for example, 30 sec to 180 sec, by positioning DIW nozzle 24 just above the center of wafer W and rotating wafer W at a predetermined revolution, for example, 100 rpm to 2000 rpm. As a result, the IPA on the surface (top surface) of wafer W is removed by the DIW. Since the DIW (water) is easily mixed with the IPA, the IPA in the hole is also substituted with the DIW. The pre-wetting process (the first pre-wet process) and the DIW substitution process (the second pre-wet process) may be alternately performed multiple times.

<Chemical Liquid Cleaning Process>

Next, the inorganic cleaning liquid which is the DHF in the exemplary embodiment is ejected from chemical liquid nozzle 20 at a predetermined flow rate, for example, 10 ml/min to 500 ml/min for a predetermined time, for example, 30 sec to 900 sec, by positioning chemical liquid nozzle 20 just above the center of wafer W and rotating wafer W at a predetermined revolution, for example, 200 rpm to 2000 rpm. As a result, the DIW on the surface (top surface) of wafer W is removed by the inorganic cleaning liquid. Since the inorganic cleaning liquid serving as an aqueous solution is easily mixed with water, the DIW in the hole is also substituted with the inorganic cleaning liquid. The polymer attached to the inner surface of the hole is removed by the substituted inorganic cleaning liquid.

<Rinse Process>

Next, the DIW is ejected from DIW nozzle 24 at a predetermined flow rate, for example, 500 L(liter)/min to 1500 L(liter)/min for a predetermined time, for example, 30 sec to 180 sec, by positioning DIW nozzle 24 just above the center of wafer W and rotating wafer W at a predetermined revolution, for example, 200 rpm to 1500 rpm. As a result, the inorganic cleaning liquid on the surface of wafer W and in the hole is cleaned by the DIW.

<IPA Substitution Process for Drying>

Next, the IPA is ejected from IPA nozzle 22 at a predetermined flow rate, for example, 10 L/min to 100 L/min for a predetermined time, for example, 30 sec to 120 sec, by positioning IPA nozzle 22 just above the center of wafer W and rotating wafer W at a predetermined revolution, for example, 200 rpm to 2000 rpm. As a result, the DIW on the surface of wafer W and in the hole is substituted with the IPA.

<Spin Drying Process>

Next, the ejection of the IPA from IPA nozzle 22 stops and a spin drying is performed for a predetermined time, for example, 10 sec to 60 sec by setting a rotation speed of wafer W to a predetermined revolution, for example, 200 rpm to 2000 rpm. Since the IPA has high volatility, the surface of wafer W and the inside of the hole are easily dried. In this case, in order to accelerate the drying process, $N_2$ gas and dry air may also be sprayed on wafer W. In this case, a nozzle (not shown) for spraying the $N_2$ gas or the dry air is installed.

After a series of processes is completed as described above, wafer W is carried out from the substrate cleaning apparatus by the transfer arm (not shown).

Next, a second exemplary embodiment of the substrate cleaning processing will be described. In the second exemplary embodiment, wafer W which is an object to be processed is also the silicon wafer of which the hole for TSV is formed by a dry etching process, as in the first exemplary embodiment. However, unlike the first exemplary embodiment, polymer (for example, CF-based polymer) suitable for cleaning with an organic cleaning liquid is attached to the inner surface of the hole. An organic cleaning liquid including dimethyl sulfoxide and an organic solvent miscible with dimethyl sulfoxide may be used as the organic cleaning liquid. The organic solvent miscible with dimethyl sulfoxide may use at least one selected from the group consisting of N,N-dimethyl acetamide, N,N-dimethyl formamide, N-methyl pyrrolindone, and N,N-dimethyl imidazolidinone.

First, wafer W in the aforementioned state is carried in the substrate cleaning apparatus by a transfer arm (not shown) to be held at substrate holding part 14 of spin chuck 10.

<Pre-Wetting Process>

Next, in the same procedure as the pre-wetting process (the first pre-wet process) of the first exemplary embodiment, the IPA is supplied to wafer W to be filled in the inside of the hole and wets the entire inner surface of the hole.

<Chemical Liquid Cleaning Process>

Next, the chemical liquid cleaning process is performed without performing the DIW substitution process (the second pre-wet process). The chemical liquid cleaning process may be performed in the same procedure as the chemical liquid cleaning process of the first exemplary embodiment. The aforementioned organic cleaning liquid is supplied to wafer W and as a result, the IPA on the surface (top surface) of wafer W is removed by the chemical liquid. Since the organic cleaning liquid is easily mixed with the IPA, the IPA in the hole is also substituted with the organic cleaning liquid and the polymer attached to the inner surface of the hole is removed by the substituted organic cleaning liquid.

<First Rinse Process (Organic Solvent Rinse Process)>

Next, the IPA is ejected from IPA nozzle 22 at a predetermined flow rate, for example, 50 ml/min to 500 ml/min for a predetermined time, for example, 30 sec to 180 sec, by positioning IPA nozzle 22 just above the center of wafer W and rotating wafer W at a predetermined revolution, for example, 200 rpm to 1500 rpm. As a result, the chemical liquid on the surface of wafer W and in the hole is substituted with the IPA. The rinse liquid used in the first rinse process is not limited to the IPA, and may also use the organic cleaning liquid used in the chemical liquid cleaning process and another organic solvent having miscibility with the DIW used in a second rinse process.

<Second Rinse Process (DIW Rinse Process)>

Next, the DIW is ejected from DIW nozzle 24 at a predetermined flow rate, for example, 500 L(liter)/min to 1500 L(liter)/min for a predetermined time, for example, 30 sec to 180 sec, by positioning DIW nozzle 24 just above the center of wafer W and rotating wafer W at a predetermined revolution, for example, 200 rpm to 1500 rpm. As a result, the IPA on the surface of wafer W and in the hole is cleaned by the DIW.

<IPA Substitution Process for Drying>

Next, in the same procedure as the IPA substitution process for drying of the first exemplary embodiment, the IPA is supplied to wafer W and the DIW on the surface of wafer W and in the hole is substituted with the IPA.

<Spin Drying Process>

Next, in the same procedure as the spin drying process of the first exemplary embodiment, a drying process of wafer W is performed. As described above, a series of processes is completed according to the second exemplary embodiment.

An exemplary embodiment of the present disclosure is not limited thereto and may be modified in consideration of details to be described below.

In the first and second exemplary embodiments, the organic solvent (pre-wet liquid) used in the pre-wetting process is the IPA, but is not limited thereto so long as the surface tension for wafer W is smaller than that of the chemical liquid. In the pre-wetting process, another organic solvent, such as for example, xylene and IPA+HFE (a mixed solution of isopropylalcohol and hydrofluoroether) may also be used. As in the first exemplary embodiment, when the chemical liquid is supplied after substituting the pre-wet liquid including the organic solvent with the DIW first, an organic solvent having miscibility with the DIW may be used as the organic solvent. The IPA in a concave portion is rapidly substituted with the water (DIW) as compared with the xylene because the IPA has high miscibility with water. Therefore, from the viewpoint of reduction in a processing time, the IPA may be used as the pre-wet liquid. In the exemplary embodiment, since the IPA is used in the IPA substitution process for the drying process performed before the spin drying process, even from the viewpoint of simplification of the device configuration such as, for example, reduction in the nozzles and the processing liquid supply system, the IPA may be used as the pre-wet liquid. The xylene has no miscibility with water, but since the xylene in the concave portion may be substituted with the water (DIW) by the diffusion of water (DIW), the xylene may be used as the pre-wet liquid. When the organic solvent (pre-wet liquid) used in the pre-wetting process is organic solvent other than the IPA and the IPA is used in the IPA substitution process for the drying process, a nozzle ejecting the organic solvent other than the IPA and a supply mechanism for supplying the organic solvent to the nozzle are separately installed.

When the chemical liquid is the organic cleaning liquid as in, for example, the second exemplary embodiment, the liquid filling the hole of wafer W just before supplying the chemical liquid to wafer W may be the organic solvent. When the liquid filling the hole of wafer W just before supplying the chemical liquid to wafer W is the DIW, the miscibility of the chemical liquid and the DIW is relatively low, and as a result, substitution efficiency may be deteriorated.

When the chemical liquid is the inorganic cleaning liquid (see the first exemplary embodiment), the liquid filling the hole just before supplying the inorganic cleaning liquid may be the DIW. For example, when the chemical liquid is a type in which the HF serving as the chemical liquid is diluted with the DIW, such as the DHF, when the IPA (pre-wet liquid including the organic solvent) is mixed with the DHF (inorganic cleaning liquid), an etching rate due to the DHF is changed, such that a stable processing may not be performed. When a stable processing can be performed even if the chemical liquid is mixed with the pre-wet liquid, even though the chemical liquid is the inorganic cleaning liquid, it is possible to perform the chemical liquid cleaning process after the pre-wetting process (the first pre-wet process) without performing the DIW substitution process, instead of performing the process order as in the first exemplary embodiment constituting "pre-wetting process (the first pre-wet process)"→the "DIW substitution process (the second pre-wet process)"→the "chemical liquid cleaning process".

The liquid supplied to wafer W (that is, the DIW in the first exemplary embodiment and the pre-wet liquid including the organic solvent in the second exemplary embodiment), just before the chemical liquid is supplied to wafer W, may be supplied in a heated state. When the chemical liquid at room temperature is supplied while the heated liquid (the DIW or the pre-wet liquid including the organic solvent) is filled in the hole, the substitution is easily progressed by heat convection. In detail, in the second exemplary embodiment, the IPA may be heated at a proper temperature of the boiling point (82.4° C.) or less, for example, 30° C. to 60° C. to be supplied. In this case, for example, a heater (not shown) heating the IPA may be interposed at IPA pipe line 22c. Before or when the chemical liquid is supplied wafer W may be heated, thereby generating the heat convection. The heating of wafer W may be implemented by installing a resistance heating heater (not shown) at substrate holding part 14 or by installing a lamp heater, for example, an LED lamp heater (not shown) above wafer W.

In the first and second exemplary embodiments, since the drying process may start in a state where the IPA is filled in the hole by preparing the IPA substitution process for the drying process, the drying process may be rapidly and precisely performed. When the aspect ratio of the hole is not so large, the IPA substitution process for drying before the spin drying process may also be omitted.

In the second exemplary embodiment, the first rinse process and the second rinse process may be repetitively performed many times.

In the second exemplary embodiment, the first rinse process with the organic solvent such as the IPA and the second rinse process with the DIW are performed. That is, even though the organic cleaning liquid in the hole is not completely removed through the first rinse process, the residue of the organic cleaning liquid in the hole may be completely removed through the second rinse process. Accordingly, the residue of the organic cleaning liquid in the hole may be reduced while reducing the consumption of the organic solvent in the first rinse process. Also, only the first rinse process may be performed without performing the second rinse process. In this case, if the organic solvent used in the first rinse process is the IPA which is the same as the organic solvent used in the IPA substitution process for the drying process, the process may proceed with the drying process instantly, which is advantageous from the viewpoint of reduction in the processing time.

In the exemplary embodiment, the concave portion which is an object to be cleaned is the hole for TSV formed on a silicon layer (Si layer) of the substrate configured by the semiconductor wafer, but is not limited thereto. Examples of the concave portion may include different kinds of concave portions formed on the semiconductor wafer, particularly, a hole (via-hole and through-hole) and a groove (trench). Particularly, a concave portion having a high aspect ratio may be effectively cleaned by the cleaning method according to the exemplary embodiments.

The concave portion which is the object to be cleaned is not limited to the concave portion formed by the silicon layer and may be concave portions formed by an SiN layer, an $SiO_2$ layer, and a poly-Si layer. According to a material of the layer in which the concave portion is formed, etching gases used in the dry etching process for forming the concave portion are different from each other. According to the quality of the material of a layer to be etched, a kind of etching gas, the quality of the material of an etching mask, compositions of an etching residue (polymer) remaining in the concave portion are different from each other. Examples of the polymer may include various polymers such as chloride-based polymer, oxide-based polymer, CF-based polymer, and carbon-based polymer. The chemical liquid used in the chemical liquid cleaning process is optimally selected according to the etching residue which is an object to be removed. That is, the chemical liquid to be used in the chemical liquid cleaning process is not limited to the DHF which is the inorganic cleaning liquid used in the first exemplary embodiment or the organic cleaning liquid used in the second exemplary embodiment. As the inorganic cleaning liquid, for example, (1) an SC-1 liquid, (2) an SC-2 liquid, or (3) an HF-based chemical liquid in which one liquid or a mixed liquid of two or more liquids selected from the group consisting of an HF liquid, an $NH_4F$ liquid, and an $NH_4HF_2$ liquid is diluted with the DIW, may be used.

The substrate which is the object to be cleaned is not limited to the semiconductor wafer and may be another substrate, such as for example, a glass substrate for an LCD.

In the substrate processing, the substrate needs not be rotated and for example, each processing liquid may also be scan-coated by using an elongated, so-called slit nozzle.

Example

First Experiment

Hereinafter, an experimental result examining a pre-wet effect will be described.

The silicon wafer, in which a bottomed hole having the diameter of 10 μm (measured in an inlet of the hole) and the depth of 100 μm was formed by dry etching, was prepared and the chemical liquid cleaning was performed thereto. As Example, after performing the pre-wetting process using the IPA (the first pre-wet process) and the DIW substitution process using the DIW (the second pre-wet process), the chemical liquid cleaning process was performed using the DHF. The first pre-wet process was performed for 60 sec under the conditions of the wafer revolution of 300 rpm, the IPA temperature of room temperature, and the IPA flow rate of 35 ml/min. The second pre-wet process was performed for 60 sec under the conditions of the wafer revolution of 300 rpm, the DIW temperature of room temperature, and the DIW flow rate of 1000 ml/min. The chemical liquid cleaning process was performed for 60 sec under the conditions of the wafer revolution of 300 rpm and the DHF flow rate of 1500 ml/min. The rinse process, the IPA substitution process, and the spin drying process were performed after the chemical liquid cleaning process. In the series of processes as described above, a case where the first pre-wet process and the second pre-wet process were omitted was set as Comparative Example, a case where the time of the chemical liquid cleaning process was 60 sec was set as Comparative Example 1, and a case where the time of the chemical liquid cleaning process was 180 sec was set as Comparative Example 2.

Figure 3:
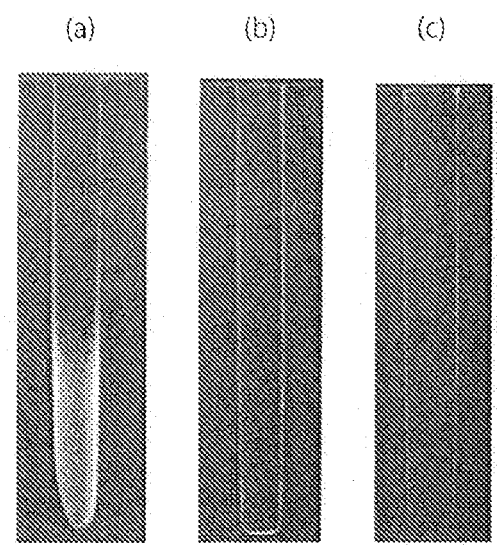
FIG. 3 is a diagram illustrating a photograph describing a first experimental result.

After completing the processing, the wafer was cut so as to check the surface of the hole, and the inner surface of the hole was observed by a scanning electron microscope. The results are shown in FIG. 3. In FIG. 3, (a) represents Comparative Example 1, (b) represents Comparative Example 2, and (c) represents the Example. The portion where the polymer remained is an insulator and charged up by an electron beam to be photographed as white. In Comparative Example 1, it has been known that the chemical liquid did not sufficiently penetrate into the hole and thus the bottom of the hole is not cleaned. In Comparative Example 2, it has been known that the chemical liquid reached the bottom of the hole, but there is a white portion on a part of the hole surface and thus the cleaning was insufficient. On the other hand, in the Example, it has been known that the entire area of the hole is sufficiently cleaned. By this experiment, it has been known that the chemical liquid may sufficiently penetrate into the deep hole in a short time by performing the pre-wetting process before the chemical liquid cleaning process.

Second Experiment

As Example, with the same condition as in the Example of the first experiment, the pre-wetting process using the IPA, the second pre-wet process using the DIW, the chemical liquid cleaning process using DHF, the rinse process, the IPA substitution process, and the spin drying process were performed in sequence. In the series of the processes, a case where the IPA substitution process was omitted was set as Comparative Example. On the wafers of the Example and the Comparative Example, an insulating film was formed by a CVD method.

Figure 4:
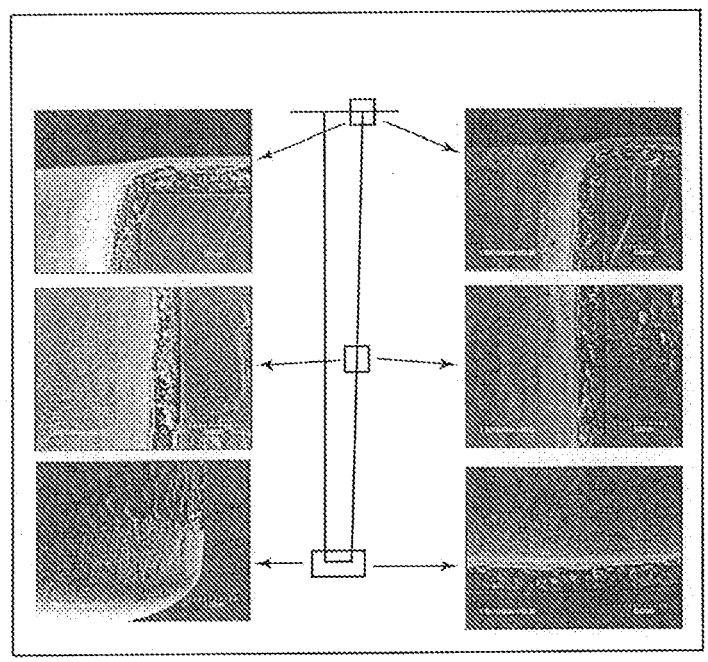
FIG. 4 is a diagram illustrating a photograph describing a second experimental result.

After forming the film, the wafer was cut so as to check the surface of the hole and the inner surface of the hole was observed by a scanning electron microscope (SEM). The result is shown in FIG. 4. In FIG. 4 where a left side column represents the Comparative Example and a right side column represents the Example. In the inlet (see, for example, a top photograph) and the center (see, for example, a middle photograph) of the hole, a significant difference was not detected in the film-formed state in the Comparative Example and the Example. Meanwhile, at the bottom (see, for example, a bottom photograph) of the hole, the film was not formed in the Comparative Example, but a good film was formed in the Example. In the Comparative Example, since the drying process of the hole bottom was not sufficient, it is considered that a problem occurred in the film formation. As a result, it has been known that the IPA substitution process is advantageous as a pre-processing of the drying process after the cleaning of a deep hole.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

What is claimed is:

1. A liquid processing method of cleaning the inside of a concave portion formed on a surface of a substrate with a cleaning liquid including a chemical liquid, the method comprising:
    disposing the substrate completed with a dry etching process in a processing container of a substrate cleaning apparatus where the substrate includes polymer attached in the inside of the concave portion of the substrate;
    supplying an organic solvent to the surface of the substrate in a state where the surface of the substrate is in a dry state thereby wetting the inside of the concave portion of the substrate with the organic solvent; and
    after the supplying in of the organic solvent and in a state where the organic solvent substantially remains in the inside of the concave portion of the substrate, supplying a chemical liquid to the surface of the substrate thereby substituting the organic solvent in the inside of the concave portion of the substrate with the chemical liquid and cleaning the polymer attached in the inside of the concave portion of the substrate,
    wherein the organic solvent has surface tension smaller than that of the chemical liquid.

2. The liquid processing method of claim 1, wherein the organic solvent is isopropylalcohol (IPA), xylene, or a mixture of the IPA and hydrofluoroether (HFE).

3. The liquid processing method of claim 1, wherein the chemical liquid is an inorganic cleaning liquid.

4. The liquid processing method of claim 3, further comprising:
    substituting the organic solvent wetting the inside of the concave portion with the deionized water (DIW) by supplying the DIW to the substrate, after the wetting and before the cleaning,
    wherein the DIW wetting the inside of the concave portion is substituted with the chemical liquid in the cleaning.

5. The liquid processing method of claim 4, wherein a heated DIW is supplied in the substituting.

6. The liquid processing method of claim 4, wherein the inorganic cleaning liquid is any one of a DHF (diluted hydrofluoride) liquid, an SC-1 liquid, an SC-2 liquid, or a HF-based chemical liquid in which one liquid or a mixed liquid of two or more liquids selected from the group consisting of an HF liquid, an $NH_4F$ liquid, and an $NH_4F_2$ liquid is diluted with the DIW.

7. The liquid processing method of claim 1, wherein the chemical liquid is an organic cleaning liquid.

8. The liquid processing method of claim 7, wherein the organic solvent wetting the inside of the concave portion is substituted with the organic cleaning liquid in the cleaning.

9. The liquid processing method of claim 7, wherein the organic cleaning liquid includes dimethyl sulfoxide and a mixture containing an organic solvent miscible with dimethyl sulfoxide.

10. The liquid processing method of claim 9, wherein the organic solvent miscible with dimethyl sulfoxide uses one or more selected from the group consisting of N,N-dimethyl acetamide, N,N-dimethyl formamide, N-methyl pyrrolindone, and N,N-dimethyl imidazolidinone.

11. The liquid processing method of claim 8, wherein a heated organic solvent is supplied in the wetting.

12. The liquid processing method of claim 7, further comprising:
    after the cleaning, supplying a first rinse liquid including an organic solvent to the substrate to substitute the chemical liquid in the concave portion with the first rinse liquid;

after the supplying the first rinse liquid, supplying a second rinse liquid including DIW to the substrate to substitute the first rinse liquid in the concave portion with the second rinse liquid; and drying the substrate, after the supplying the second rinse liquid.

13. The liquid processing method of claim 12, wherein IPA is supplied to the substrate in the drying.

14. The liquid processing method of claim 1, further comprising:

after the cleaning, rinsing the substrate by supplying a rinse liquid to the substrate to substitute the chemical liquid in the concave portion with the rinse liquid; and after the rinsing, drying the substrate, wherein IPA is supplied to the substrate in the drying.

15. A liquid processing apparatus, comprising:

a substrate holding part configured to hold a substrate;

a chemical liquid nozzle configured to eject a cleaning liquid including a chemical liquid;

an organic solvent nozzle configured to eject an organic solvent having surface tension smaller than the chemical liquid;

an organic solvent supply mechanism configured to supply the organic solvent to the organic solvent nozzle;

a chemical liquid supply mechanism configured to supply the chemical liquid to the chemical liquid nozzle; and a controller configured to control an overall operation of the liquid processing apparatus, wherein the controller is programmed to perform a liquid processing method comprising:

disposing the substrate completed with a dry etching process in a processing container of the liquid processing apparatus where the substrate includes polymer attached in the inside of a concave portion;

supplying the organic solvent to the surface of the substrate in a state where the surface of the substrate in a dr state thereby wetting the inside of the concave portion of the substrate with the organic solvent;

after the supplying of the organic solvent and in a state where the organic solvent substantially remains in the inside of the concave portion of the substrate, supplying the chemical liquid to the surface of the substrate thereby substituting the organic solvent in the inside of the concave portion of the substrate with the chemical liquid and cleaning the polymer attached in the inside of the concave portion of the substrate, wherein the organic solvent has surface tension smaller than that of the chemical liquid.

16. The liquid processing apparatus of claim 15, further comprising:

a DIW nozzle configured to eject deionized water (DIW); and a DIW supply mechanism configured to supply the DIW to the DIW nozzle, wherein the controller controls the operation of the DIW supply mechanism to further perform a DIW substitution of substituting the organic solvent on the substrate with the DIW by supplying the DIW to the substrate, between the wetting and the cleaning.

17. The liquid processing apparatus of claim 15, wherein the controller is configured to perform the cleaning so that the organic solvent on the substrate is directly substituted with the chemical liquid by supplying the chemical liquid to the substrate in the cleaning.

18. A non-transitory computer-readable storage medium storing a program that, when executed, causes a computer to control a liquid processing apparatus to perform a liquid processing method where the liquid processing apparatus comprises:

a chemical liquid nozzle configured to eject a chemical liquid;

an organic solvent nozzle configured to eject an organic solvent;

an organic solvent supply mechanism configured to supply the organic solvent to the organic solvent nozzle;

a chemical liquid supply mechanism configured to supply the chemical liquid to the chemical liquid nozzle; and a controller configured to control an overall operation of the liquid processing apparatus to perform the liquid processing method, wherein the liquid processing method comprising:

disposing the substrate completed with a dry etching process in a processing container of the liquid processing apparatus where the substrate includes polymer attached in the inside of a concave portion;

supplying the organic solvent to the surface of the substrate in a state where the surface of the substrate in a dr state thereby wetting the inside of the concave portion of the substrate with the organic solvent;

after the supplying in of the organic solvent and in a state where the organic solvent substantially remains in the inside of the concave portion of the substrate, supplying the chemical liquid to the surface of the substrate thereby substituting the organic solvent in the inside of the concave portion of the substrate with the chemical liquid and cleaning the polymer attached in the inside of the concave portion of the substrate, wherein the organic solvent has surface tension smaller than that of the chemical liquid.

19. The non-transitory computer-readable storage medium of claim 18, wherein the liquid processing apparatus further comprising:

a DIW nozzle configured to eject deionized water (DIW); and a DIW supply mechanism configured to supply the DIW to the DIW nozzle, wherein the controller controls the operation of the DIW supply mechanism to further perform substituting the organic solvent on the substrate with the DIW by supplying the DIW to the substrate, between the wetting and the cleaning.

20. The non-transitory computer-readable storage medium of claim 18, wherein the controller is configured to perform the cleaning so that the organic solvent on the substrate is directly substituted with the chemical liquid by supplying the chemical liquid to surface of the substrate in the cleaning.

* * * * *